(12) United States Patent
Ko et al.

(10) Patent No.: US 11,469,099 B2
(45) Date of Patent: Oct. 11, 2022

(54) SEMICONDUCTOR PACKAGE WITH CHIP END DESIGN AND TRENCHES TO CONTROL FILLET SPREADING IN STACKED CHIP PACKAGES

(71) Applicant: SAMSUNG ELECTRONICS CO., LTD., Suwon-si (KR)

(72) Inventors: Jungmin Ko, Hwaseong-si (KR); Hyeongmun Kang, Hwaseong-si (KR); Sangsick Park, Hwaseong-si (KR); Hyeonjun Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/905,310

(22) Filed: Jun. 18, 2020

(65) Prior Publication Data

US 2021/0143008 A1    May 13, 2021

(30) Foreign Application Priority Data

Nov. 13, 2019   (KR) ......................... 10-2019-0145294

(51) Int. Cl.
| | | |
|---|---|---|
| *G11C 5/06* | (2006.01) | |
| *H01L 27/108* | (2006.01) | |
| *H01L 21/02* | (2006.01) | |
| *H01L 21/56* | (2006.01) | |
| *H01L 21/762* | (2006.01) | |

(52) U.S. Cl.
CPC ...... *H01L 21/02304* (2013.01); *H01L 21/561* (2013.01); *H01L 21/563* (2013.01); *H01L 21/76224* (2013.01)

(58) Field of Classification Search
CPC .............. H01L 23/49582; H01L 24/32; H01L 23/49513; H01L 23/49503; H01L 24/83; H01L 24/27; H01L 2224/27013; H01L 2224/32245; H01L 2924/01029; H01L 2224/83385; H01L 2924/14; H01L 2224/32257; H01L 2924/01033; H01L 2924/01047; H01L 2924/00
See application file for complete search history.

(56) References Cited

U.S. PATENT DOCUMENTS

| | | | |
|---|---|---|---|
| 7,122,893 B2 | 10/2006 | Weng et al. | |
| 7,179,683 B2 | 2/2007 | Low et al. | |
| 7,838,974 B2 | 11/2010 | Poddar et al. | |
| 10,497,675 B2 * | 12/2019 | Kwak | ............... H01L 23/49827 |

(Continued)

FOREIGN PATENT DOCUMENTS

| | | |
|---|---|---|
| KR | 1998-0007886 | 3/1998 |
| KR | 10-1162508 | 7/2012 |

(Continued)

*Primary Examiner* — Nicholas J Tobergte
*Assistant Examiner* — Tenley H Schofield
(74) *Attorney, Agent, or Firm* — F. Chau & Associates, LLC

(57) ABSTRACT

A semiconductor package includes a buffer, a chip stack mounted on the buffer, an adhesive layer disposed between the buffer and the chip stack, and a molding material surrounding the chip stack. The buffer includes a plurality of trenches disposed adjacent to a plurality of edges of the buffer. Each of the trenches is shorter than a corresponding adjacent edge of a chip area of the buffer.

18 Claims, 20 Drawing Sheets

(56) References Cited

U.S. PATENT DOCUMENTS

| | | | |
|---|---|---|---|
| 2004/0245652 A1* | 12/2004 | Ogata | H01L 25/50 |
| | | | 257/777 |
| 2007/0075404 A1* | 4/2007 | Dimaano | H01L 23/49503 |
| | | | 257/666 |
| 2007/0215990 A1* | 9/2007 | San Antonio | H01L 21/4832 |
| | | | 257/666 |
| 2009/0072367 A1* | 3/2009 | Poddar | H01L 24/83 |
| | | | 257/676 |
| 2009/0152691 A1* | 6/2009 | Nguyen | H01L 24/97 |
| | | | 257/667 |
| 2009/0230521 A2* | 9/2009 | Zhang | H01L 23/49503 |
| | | | 257/669 |
| 2010/0025847 A1* | 2/2010 | Tomura | H01L 24/75 |
| | | | 257/737 |
| 2011/0198752 A1* | 8/2011 | Nondhasitthichai | H01L 23/49513 |
| | | | 257/738 |
| 2016/0141218 A1* | 5/2016 | Horibe | H01L 21/6835 |
| | | | 257/737 |
| 2017/0365591 A1* | 12/2017 | Chang | H01L 24/75 |
| 2018/0190576 A1* | 7/2018 | Rodriguez | H01L 23/49503 |
| 2019/0273075 A1 | 9/2019 | Chang et al. | |

FOREIGN PATENT DOCUMENTS

| | | |
|---|---|---|
| KR | 10-2017-0141856 | 12/2017 |
| KR | 10-1807420 | 12/2017 |

\* cited by examiner

SEMICONDUCTOR PACKAGE WITH CHIP END DESIGN AND TRENCHES TO CONTROL FILLET SPREADING IN STACKED CHIP PACKAGES

CROSS-REFERENCE TO RELATED APPLICATIONS

This application claims priority under 35 U.S.C. § 119 to Korean Patent Application No. 10-2019-0145294, filed on Nov. 13, 2019 in the Korean Intellectual Property Office, the disclosure of which is incorporated by reference herein in its entirety.

TECHNICAL FIELD

Exemplary embodiments of the present disclosure relate to a semiconductor package capable of reducing the occurrence of defects in a package, such as, for example, moisture absorption or delamination, due to leakage of a fillet of an adhesive layer.

DISCUSSION OF THE RELATED ART

In a semiconductor package including a chip stack, a non-conductive film (NCF) may be used to bond individual chips that are stacked on each other, and/or to bond the lowermost chip of the chip stack to a buffer or a substrate. In this case, the NCF is disposed between vertically adjacent chips or between the lowermost chip and the buffer, and then these components are compressed and thus bonded to each other.

In the compression process, the NCF may escape to the outside of the chip area and may form a fillet. The fillet of the NCF between the vertically stacked chips may spread on the edges of the chips in the upward-downward direction, but the fillet of the NCF between the lowermost chip and the buffer may spread only in the upward direction because the buffer has a larger area than the chip. That is, the fillet of the NCF between the lowermost chip and the buffer may spread excessively in the horizontal direction, and may come into contact with the chip stack of a neighboring package, which may cause cracking. Further, the fillet may leak outside a molding material of the package, which may cause defects in the semiconductor package, such as, for example, moisture absorption or delamination.

SUMMARY

Exemplary embodiments of the present disclosure provide a semiconductor package that includes a chip stack and a trench formed in a buffer to accommodate a fillet of an adhesive layer, thereby maintaining the width of the fillet of the adhesive layer to be substantially constant, and reducing the occurrence of defects such as, for example, moisture absorption or delamination, which may occur due to leakage of the fillet to the outside of the package.

A semiconductor package in accordance with an exemplary embodiment of the present disclosure may include a buffer, a chip stack mounted on the buffer, an adhesive layer disposed between the buffer and the chip stack, and a molding material surrounding the chip stack. The buffer includes a plurality of trenches disposed adjacent to a plurality of edges of the buffer. Each of trenches is shorter than a corresponding adjacent edge of a chip area of the buffer.

A semiconductor package in accordance with an exemplary embodiment of the present disclosure includes a buffer, a chip stack mounted on the buffer, an adhesive layer disposed between the buffer and the chip stack, and a molding material surrounding the chip stack. The buffer includes a trench. The trench has a frame shape in a top view. A center portion of each side of the trench has a greater depth than a corner portion of each side of the trench.

A semiconductor package in accordance with an exemplary embodiment of the present disclosure includes a buffer, a chip stack mounted on the buffer, an adhesive layer disposed between the buffer and the chip stack, and a molding material surrounding the chip stack. The buffer includes a chip area occupied by the chip stack in a top view, a plurality of buffer bumps disposed on the top surface of the buffer, and a plurality of trenches disposed adjacent to a plurality of edges of the buffer. The chip stack includes a plurality of chips stacked on one another, and a plurality of inter-chip adhesive layers disposed between the plurality of chips. Each of the plurality of chips includes a plurality of chip bumps. The adhesive layer includes a fillet. A portion of the fillet is located in at least one of the plurality of trenches. A length of each of the plurality of trenches is about 50% to about 90% of a length of a corresponding adjacent edge of the chip area of the buffer. An inner side surface of each of the plurality of trenches is located within the chip area in a top view. An outer side surface of each of the plurality of trenches is located outside the chip area in the top view.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF EXEMPLARY EMBODIMENTS

Figure 1:
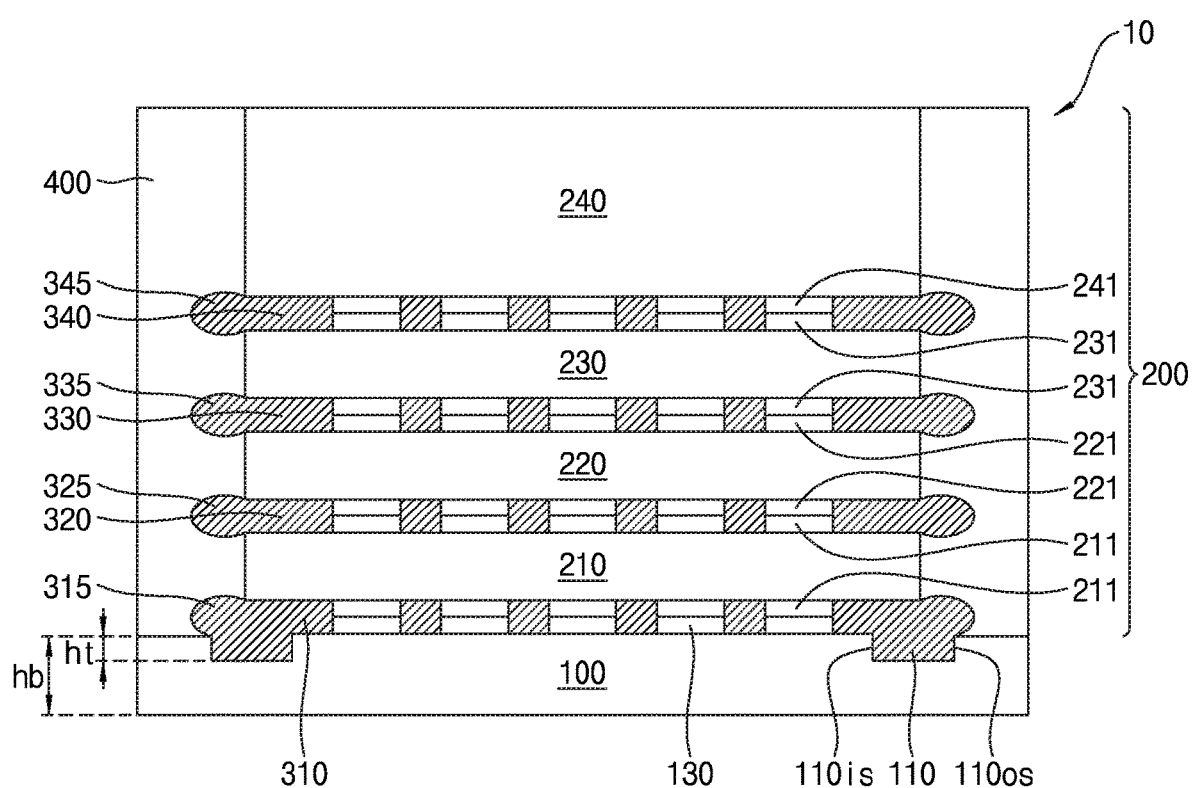
FIG. 1 is a view illustrating a side cross-section of a semiconductor package according to an exemplary embodiment of the disclosure.

Exemplary embodiments of the present disclosure will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of the word "substantially" and "about" should be construed in a like fashion.

FIG. 1 is a view illustrating a side cross-section of a semiconductor package 10 according to an exemplary embodiment of the present disclosure.

Referring to FIG. 1, the semiconductor package 10 according to an exemplary embodiment may include a buffer 100, a chip stack 200, an adhesive layer 310, and a molding material 400.

The chip stack 200 may be mounted on the buffer 100. The buffer 100 may connect the chip stack 200 to an external circuit. The buffer 100 may support the chip stack 200 and protect the same from external impacts. For example, the buffer 100 may include a silicon substrate or a printed circuit board (PCB).

Figure 2:
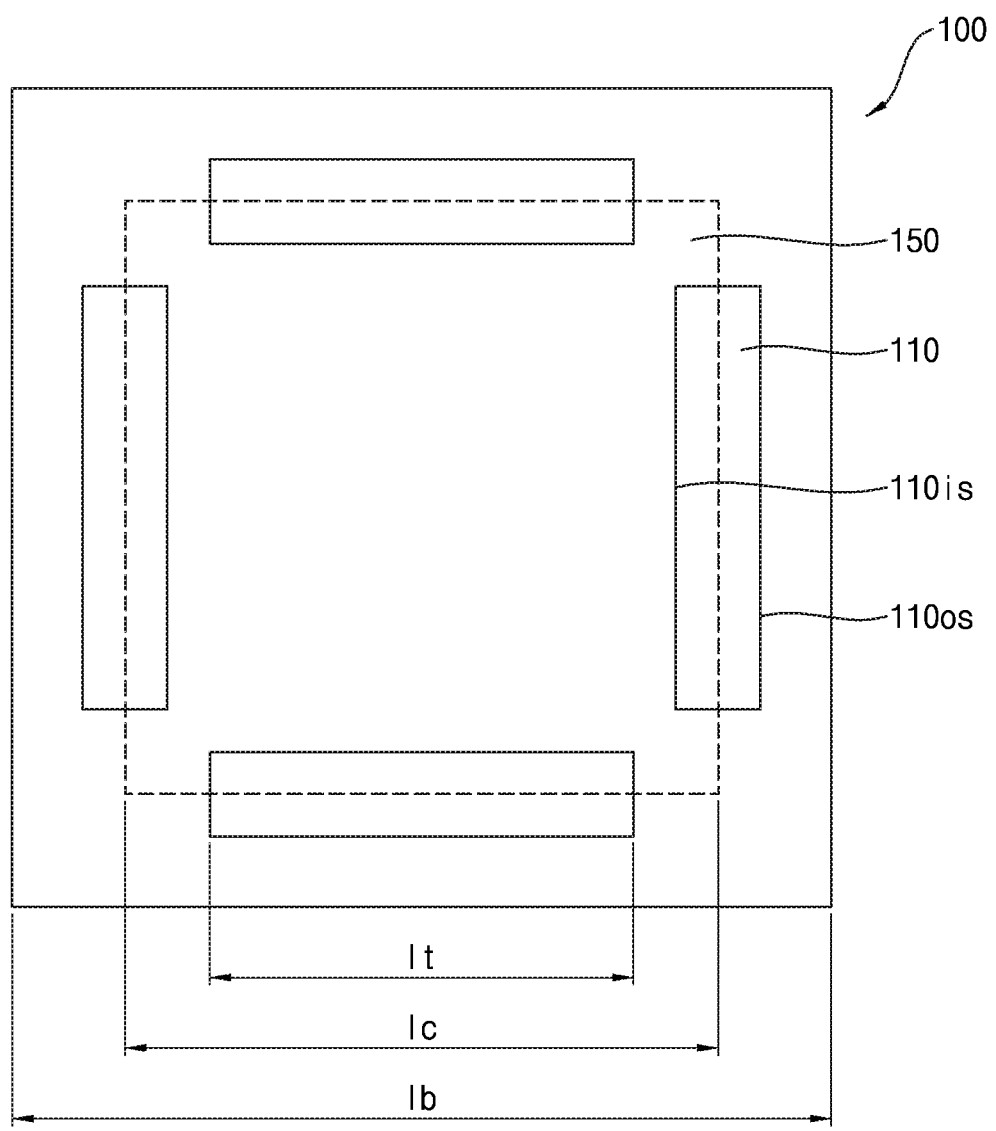
FIG. 2 is a top view of the buffer according to an exemplary embodiment of the present disclosure.

The buffer 100 may include a plurality of trenches 110 disposed adjacent to and parallel to the edges thereof, buffer bumps 130 disposed on the top surface thereof, and a chip area 150 occupied by the chip stack 200 in a top view (see FIG. 2). For example, in an exemplary embodiment, a trench 110 may be disposed adjacent to each of the edges of the buffer 100. Herein, when details of a single trench 110 are described, it is to be understood that the details may apply to each of the plurality of trenches 110. Further, when a trench 110 is described relative to an edge of the buffer 100 or an edge of the chip area 150, it is to be understood that the edge may refer to the corresponding adjacent edge relative to that trench 110.

The buffer bumps 130 may be in contact with chip bumps 211 disposed on the bottom surface of a lowermost chip 210 of the chip stack 200. The trench 110 may be formed by being recessed downwards in the top surface of the buffer 100. The trench 110 may include an inner side surface 110*is* and an outer side surface 110*os*. A portion of the adhesive layer 310 and a portion of a fillet 315 of the adhesive layer 310 may be accommodated in the trench 110. In an exemplary embodiment, a portion of the molding material 400 may be accommodated in the trench 110.

Referring to FIG. 1, the depth ht of the trench 110 may be about 50% or less of the vertical thickness hb of the buffer 100. The depth ht of the trench 110 may vary depending on the thickness of the adhesive layer 310. For example, when the adhesive layer 310 is thick, and thus, the fillet 315 of the adhesive layer 310 is likely to be formed excessively, the depth ht of the trench 110 may be increased. When the adhesive layer 310 is thin, or when there is a large extra space outside the chip area 150 of the buffer 100, the depth ht of the trench 110 may be reduced.

The chip stack 200 may include a plurality of chips 210, 220, 230 and 240, which are stacked on one another, and inter-chip adhesive layers 320, 330 and 340, which are disposed between the plurality of chips 210, 220, 230 and 240. Each of the chips 210, 220, 230 and 240 may include, for example, a memory chip or a logic chip such as a dynamic random access memory (DRAM) chip. However, the chips 210, 220, 230 and 240 are not limited thereto. Referring to FIG. 1, the uppermost chip 240 of the chip stack 200 may be thicker than any of the other chips 210, 220 and 230. For example, the uppermost chip 240 may be the thickest chip of the chips 210, 220, 230 and 240 that form the chip stack 200. The height of the semiconductor package 10 may be adjusted by adjusting the thickness of the uppermost chip 240.

The chips 210, 220, 230 and 240 may include a plurality of chip bumps 211, 221, 231 and 241, respectively. The stacked chips 210, 220, 230 and 240 may be connected to each other via the chip bumps 211, 221, 231 and 241 disposed on the top surfaces or the bottom surfaces thereof.

The inter-chip adhesive layers 320, 330 and 340 may be disposed between the stacked chips 210, 220, 230 and 240 to fix the chip bumps 211, 221, 231 and 241 in place. The inter-chip adhesive layers 320, 330 and 340 may include inter-chip fillets 325, 335 and 345, respectively, which protrude out of the chip area 150 of the buffer 100 in a top view. The inter-chip fillets 325, 335 and 345 may radially spread on the edge portions of the chips 210, 220, 230 and 240. Each of the inter-chip adhesive layers 320, 330 and 340 may include a non-conductive film (NCF).

The adhesive layer 310 may be disposed between the buffer 100 and the chip stack 200. The adhesive layer 310 may fix the buffer bumps 130 and the chip bumps 211 in place. The adhesive layer 310 may include a non-conductive film (NCF). The adhesive layer 310 may include a fillet 315, which may protrude out of the chip area 150 of the buffer 100 in a top view. The fillet 315 may radially spread on the edge portion of the lowermost chip 210, and a portion of the fillet 315 may be located in the trench 110.

When the fillet 315 of the adhesive layer 310 leaks out of the molding material 400 of the semiconductor package 10, a gap may be formed between the molding material 400 and the buffer 100. If moisture is introduced into such a gap, this may cause a defect, such as moisture absorption, in the semiconductor package 10, and if the part in which the gap is present is weakened, this may cause a defect, such as delamination, in the semiconductor package 10. Therefore, according to exemplary embodiments, the fillet 315 is guided into the trench 110 to prevent leakage of the fillet 315 to the outside of the semiconductor package 10, thereby reducing the occurrence of defects such as moisture absorption or delamination in the semiconductor package 10.

The molding material 400 may cover a portion of the top surface of the buffer 100, and may surround the chip stack 200. The molding material 400 may cover the outside of the chip area 150 of the buffer 100. The molding material 400 may include an epoxy molding compound (EMC). A portion of the molding material 400 may be located in the trench 110. The molding material 400 may protect the chip stack 200 from the external environment, and may be a housing produced in a mold process. In an exemplary embodiment, the top surface of the chip stack 200 may be exposed rather than being covered with the molding material 400.

FIG. 2 is a top view of the buffer 100 according to an exemplary embodiment of the present disclosure.

As described above, the trench 110 may include an inner side surface 110is and an outer side surface 110os. In a top view, the inner side surface 110is of the trench 110 may be located within the chip area 150 of the buffer 100, and the outer side surface 110os of the trench 110 may be located outside the chip area 150. For example, the inner side surface 110is of the trench 110 may be located within a periphery of the chip area 150, and the outer side surface 110os of the trench 110 may be located outside of the periphery of the chip area 150 in a plan view. In an exemplary embodiment, the inner side surface 110is and the outer side surface 110os of the trench 110 may be about equally spaced apart from the edge (e.g., the periphery) of the chip area 150. For example, a distance between the inner side surface 110is and the periphery of the chip area 150 may be about equal to a distance between the outer side surface 110os and the periphery of the chip area 150.

Referring to FIG. 2, each of the trenches 110 may be shorter than a respective one of the edges of the chip area 150 of the buffer 100. That is, each of the trenches 110 may be shorter than a corresponding adjacent edge of the chip area 150 of the buffer 100. For example, the length lt of the trench 110 may be about 50% to about 90% of the length lc of the edge of the chip area 150. In FIG. 2, lb represents the length of the buffer 100.

Figure 3:
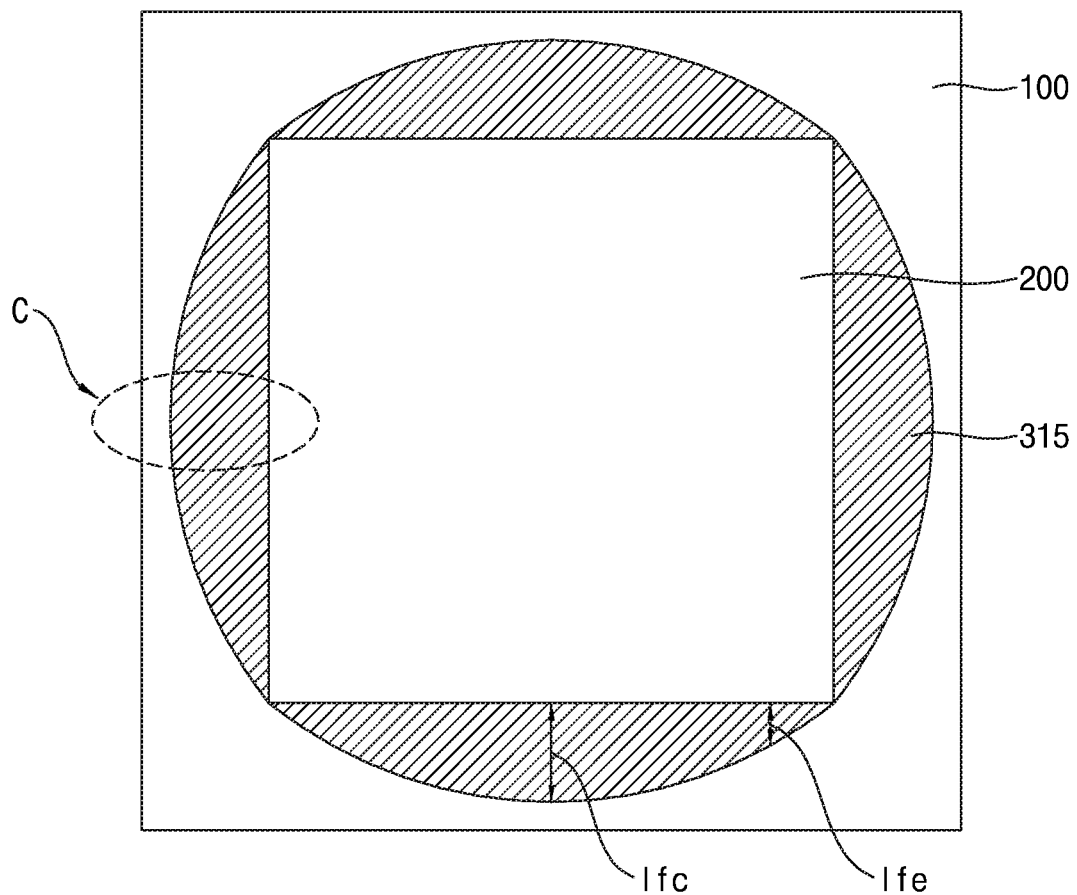
FIG. 3 is a view illustrating the distribution of a fillet when a trench is absent from a buffer.

FIG. 3 is a view illustrating the distribution of the fillet 315 when the trench 110 is absent from the buffer 100.

In the absence of the trench 110, the fillet 315 of the adhesive layer 310 further spreads toward the edge of the buffer 100 from a center portion C of the edge of the chip stack 200, which is mounted in the chip area 150, than from the corner portion of the edge of the chip stack 200. That is, referring to FIG. 3, the width lfc of the fillet 315 at the center portion C of the edge may be greater than the width lfe of the fillet 315 at the corner portion of the edge. The spread of the fillet 315 may gradually increase from the corner portion of the edge toward the center portion C of the edge.

Referring back to FIG. 2, if the length lt of the trench 110 is about equal to or greater than the length lc of the edge of the chip area 150, the fillet 315 further spreads outwards from the center portion C of the edge of the chip area 150, similar to the case in which the trench 110 is absent. That is, the difference between the width lfc of the fillet 315 at the center portion C of the edge and the width lfe of the fillet 315 at the corner portion of the edge increases. Referring again to FIG. 3, in this case, the fillet 315 may have a circular or elliptical shape in a top view, and the possibility of leakage of the fillet 315 to the outside from the center portion C of the edge of the buffer 100 increases.

Figure 4:
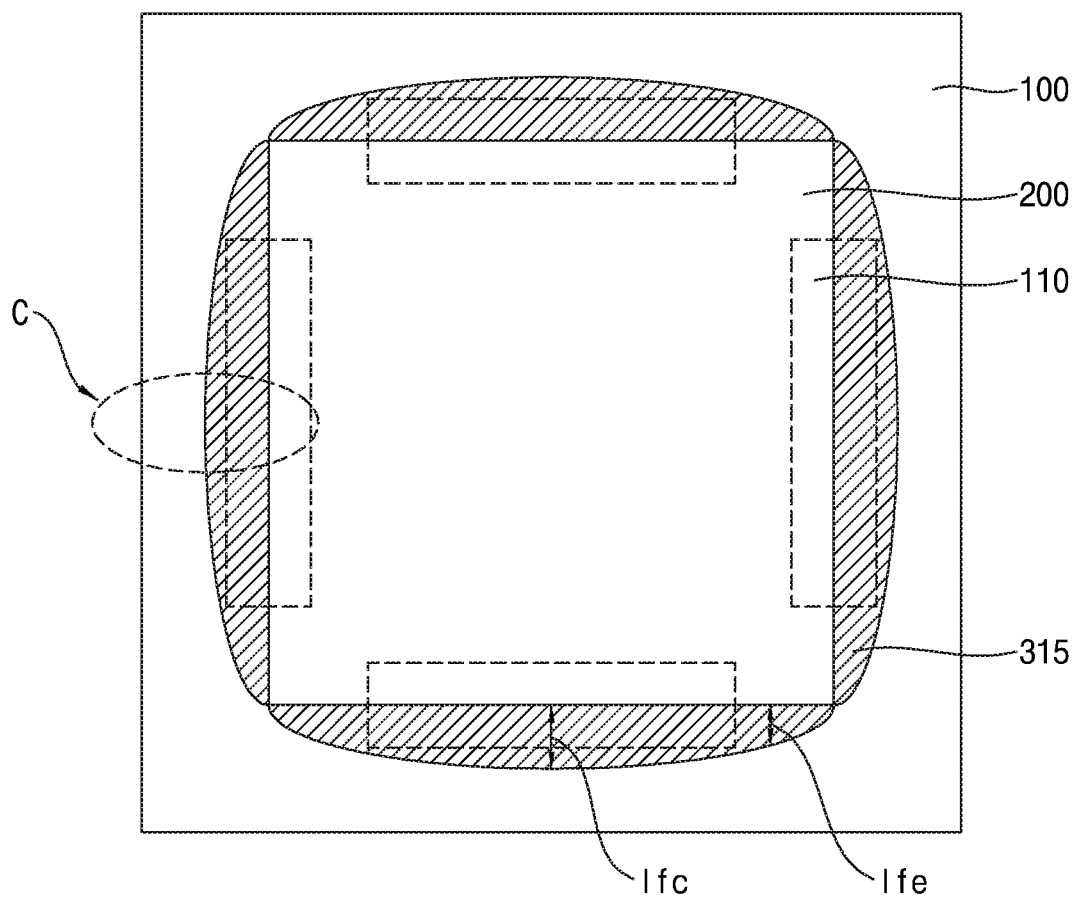
FIG. 4 is a view illustrating the distribution of a fillet when a trench is formed in a buffer according to an exemplary embodiment of the present disclosure.

FIG. 4 is a view illustrating the distribution of the fillet 315 when the trench 110 is formed in the buffer 100 according to an exemplary embodiment of the present disclosure.

Referring to FIG. 4, the widths lfc and lfe of the fillet 315 may be maintained comparatively constant in a top view by making the length lt of the trench 110 shorter than the length lc of the edge of the chip stack 200 mounted in the chip area 150 (see FIG. 2). That is, the width lfe of the fillet 315 at the corner portion of the edge and the width lfc of the fillet 315 at the center portion C of the edge may be about equal to each other, or the difference therebetween may be small. For example, comparing FIG. 4 to FIG. 3, it can be seen that whereas the difference between the lengths lfc and lfe when the trench 110 is absent may be great (see FIG. 3), the difference between the lengths lfc and lfe when the trench 110 is included may be small or non-existent. Further, the flow of the fillet 315 may be adjusted according to the structure of the trench 110 so that the adhesive layer 310 is effectively spread even to the corner portions of the chip area 150.

Figure 5:
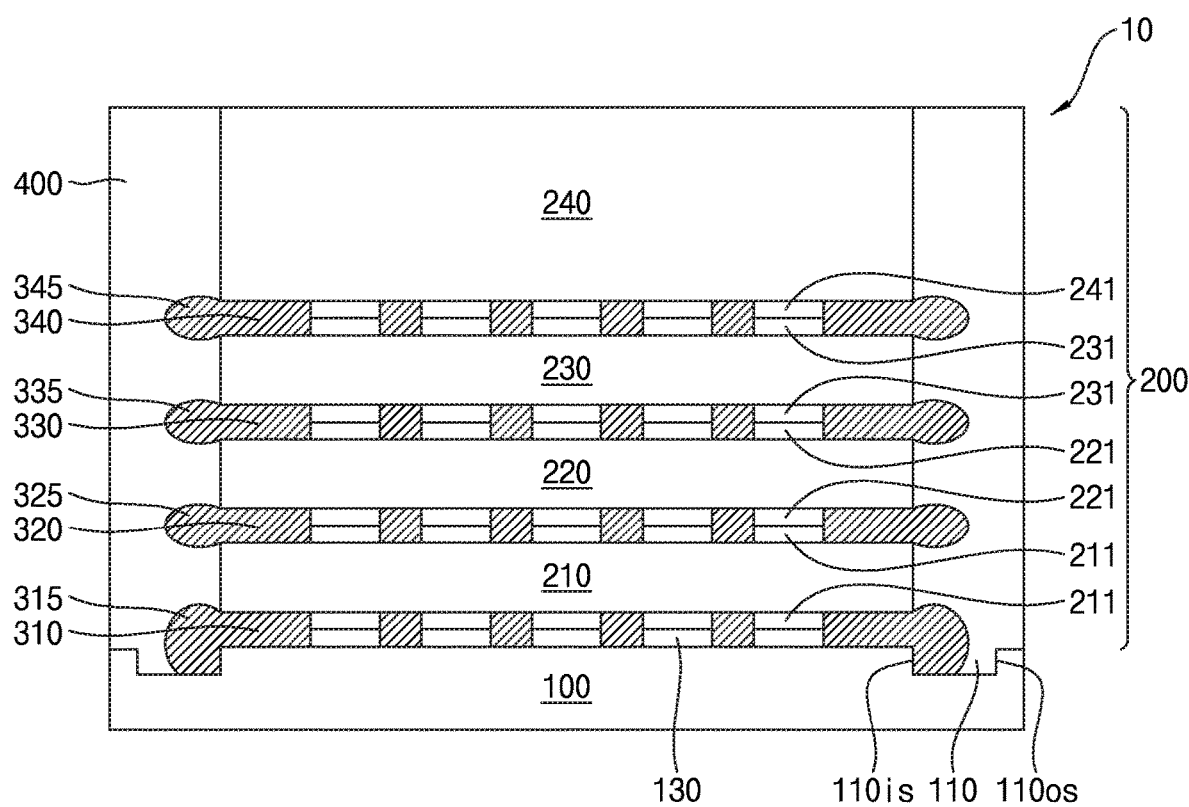
FIG. 5 is a view illustrating a side cross-section of a semiconductor package according to an exemplary embodiment of the present disclosure.
Figure 6:
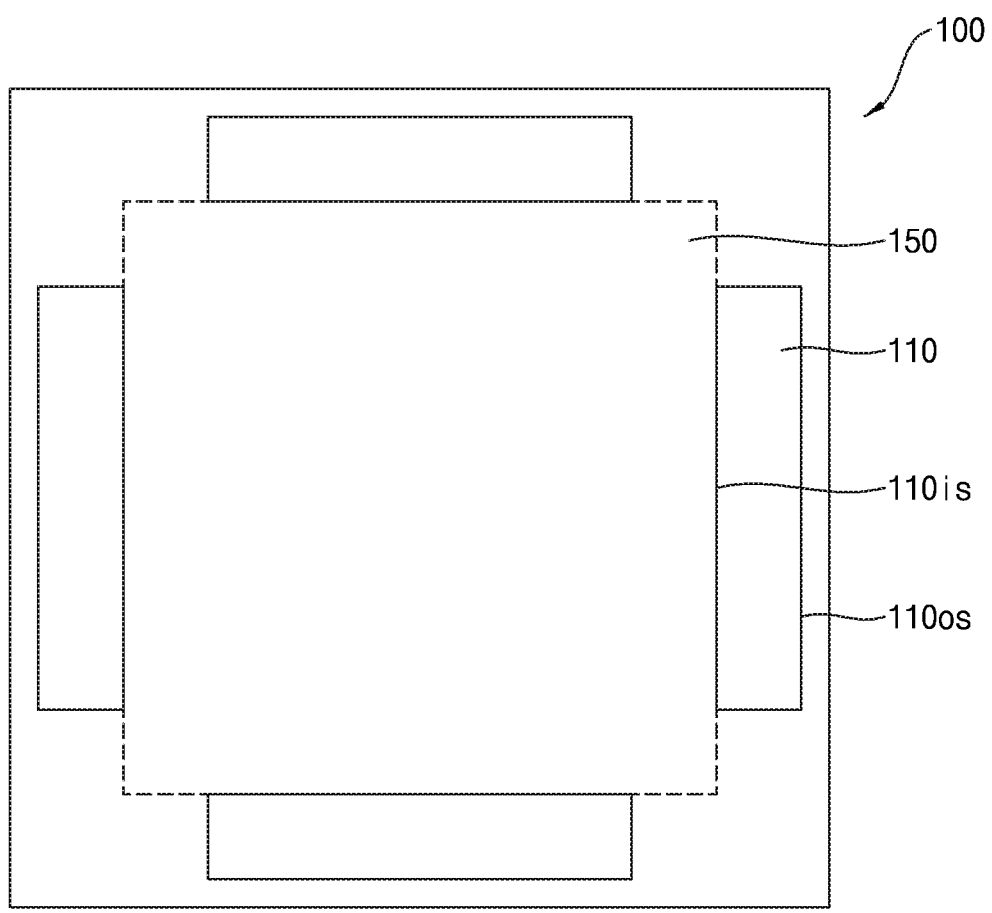
FIG. 6 is a top view of a buffer according to an exemplary embodiment of the present disclosure.

FIG. 5 is a view illustrating a side cross-section of the semiconductor package 10 according to an exemplary embodiment of the present disclosure. FIG. 6 is a top view of the buffer 100 according to an exemplary embodiment of the present disclosure. For convenience of explanation, a further description of elements and technical aspects previously described may be omitted.

Referring to FIGS. 5 and 6, the inner side surface 110is of the trench 110 may be vertically aligned with the edge of the chip area 150 of the buffer 100. For example, each of the plurality of trenches 110 may be vertically aligned with the corresponding adjacent edge of the chip area 150. When the inner side surface 110is of the trench 110 is vertically aligned with the edge of the chip area 150 of the buffer 100, the fillet 315 of the adhesive layer 310 as well as the inter-chip fillets 325, 335 and 345 of the inter-chip adhesive layers 320, 330 and 340 may radially spread from the edges of the chips 210, 220, 230 and 240. Accordingly, the fillet 315 of the adhesive layer 310 between the buffer 100 and the lowermost chip 210 may be prevented from leaking excessively toward the edge of the buffer 100.

In an exemplary embodiment, the inner side surface 110is of the trench 110 may be located outside the edge of the chip area 150. When the trench 110 is located outside the chip area 150, the flow of the fillet 315 may be blocked, and thus, leakage of the fillet 315 to the outside of the semiconductor package 10 may be prevented.

Figure 7:
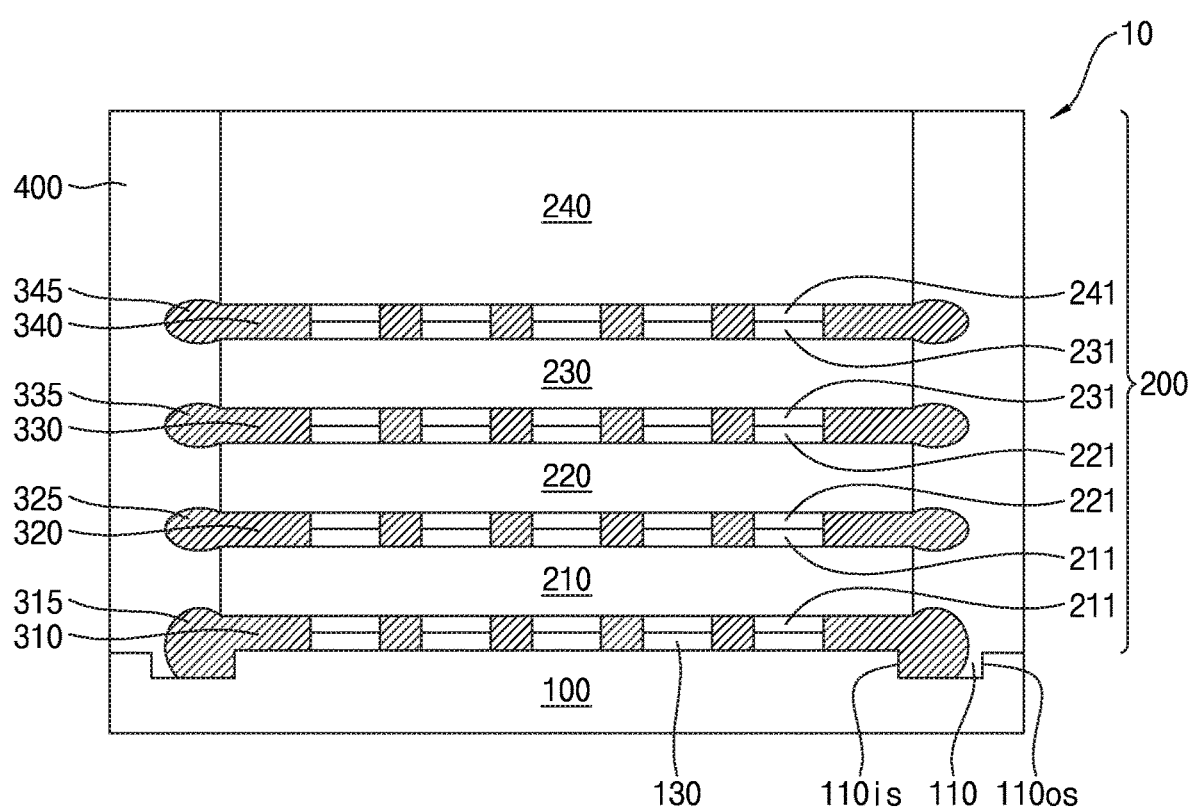
FIG. 7 is a view illustrating a side cross-section of a semiconductor package according to an exemplary embodiment of the present disclosure.
Figure 8:
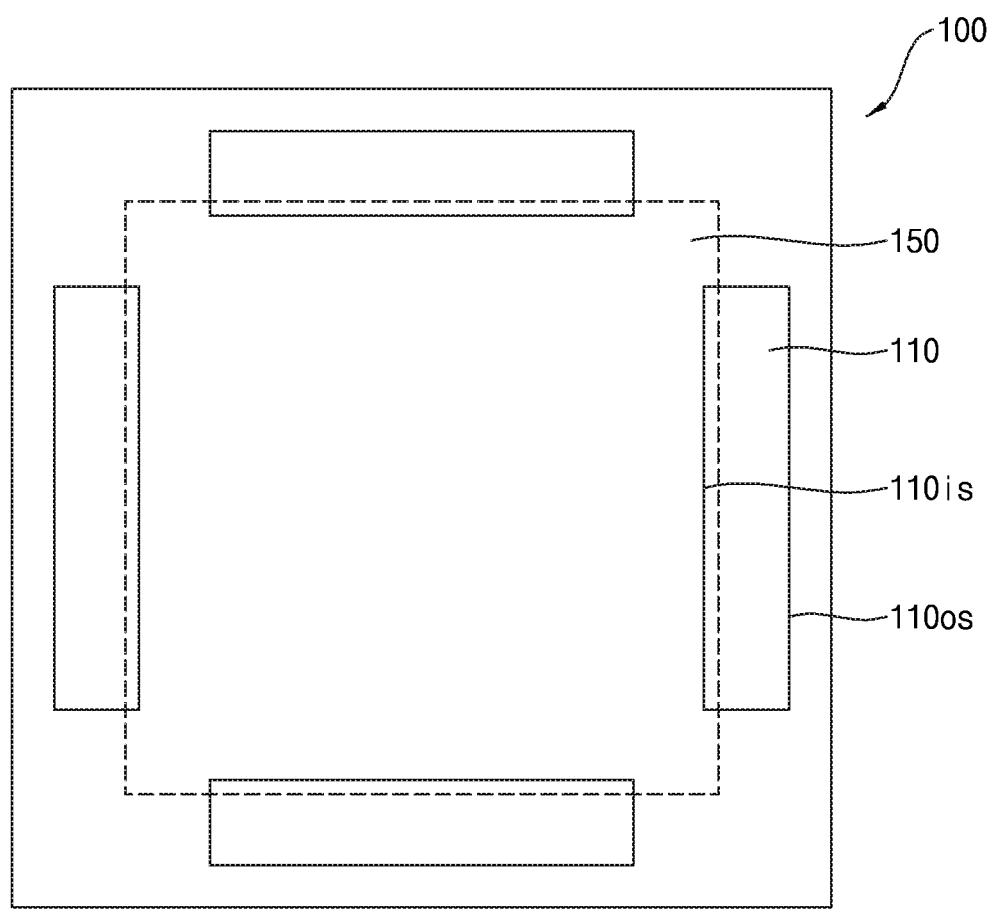
FIG. 8 is a top view of a buffer according to an exemplary embodiment of the present disclosure.

FIG. 7 is a view illustrating a side cross-section of the semiconductor package 10 according to an exemplary embodiment of the present disclosure. FIG. 8 is a top view of the buffer 100 according to an exemplary embodiment of the present disclosure. For convenience of explanation, a further description of elements and technical aspects previously described may be omitted.

Referring to FIGS. 7 and 8, in a top view, the inner side surface 110is of the trench 110 may be located within the chip area 150 of the buffer 100, and the outer side surface 110os of the trench 110 may be located outside the chip area 150. The inner side surface 110is and the outer side surface 110os of the trench 110 may be spaced apart from the edge of the chip area 150 by different respective distances. For example, a distance between the inner side surface 110is and the edge (periphery) of the chip area 150 may be different from a distance between the outer side surface 100os and the edge (periphery) of the chip area 150. For example, as shown in FIG. 8, the distance between the inner side surface 110is and the edge (periphery) of the chip area 150 may be smaller than the distance between the outer side surface 110os and the edge (periphery) of the chip area 150.

Figure 9:
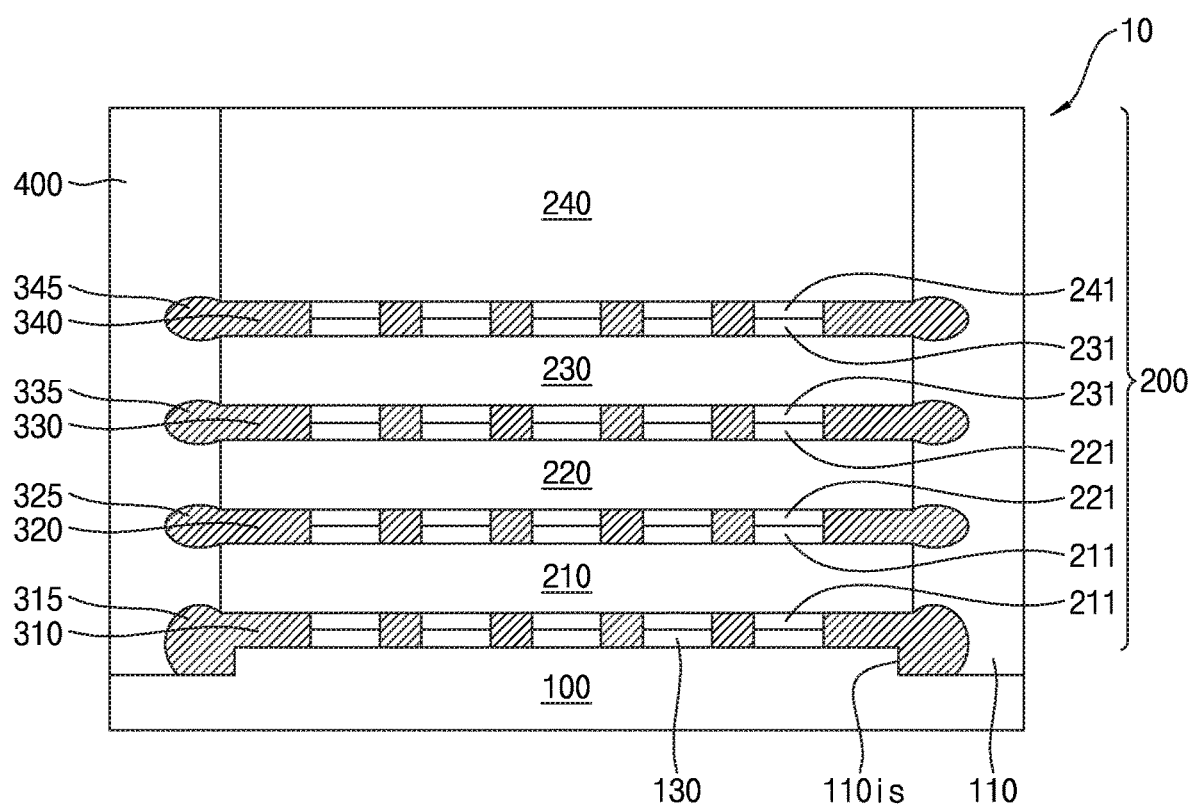
FIG. 9 is a view illustrating a side cross-section of a semiconductor package according to an exemplary embodiment of the present disclosure.
Figure 10:
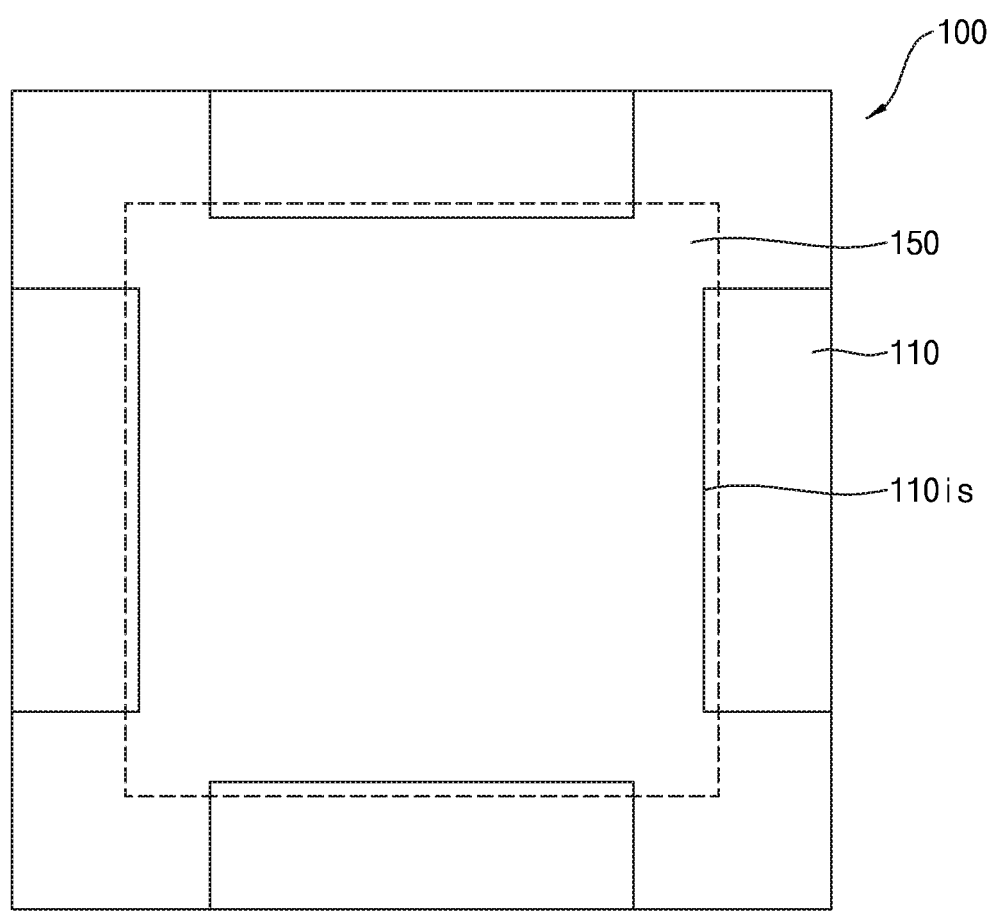
FIG. 10 is a top view of a buffer according to an exemplary embodiment of the present disclosure.

FIG. 9 is a view illustrating a side cross-section of the semiconductor package 10 according to an exemplary embodiment of the present disclosure. FIG. 10 is a top view of the buffer 100 according to an exemplary embodiment of the disclosure. For convenience of explanation, a further description of elements and technical aspects previously described may be omitted.

Referring to FIGS. 9 and 10, the trench 110 may be open to the outside of the buffer 100. For example, the inner side surface 110is of the trench 110 may be located within the edge (periphery) of the chip area 150, and the trench 110 may extend to an edge (periphery) of the buffer 100.

Figure 11:
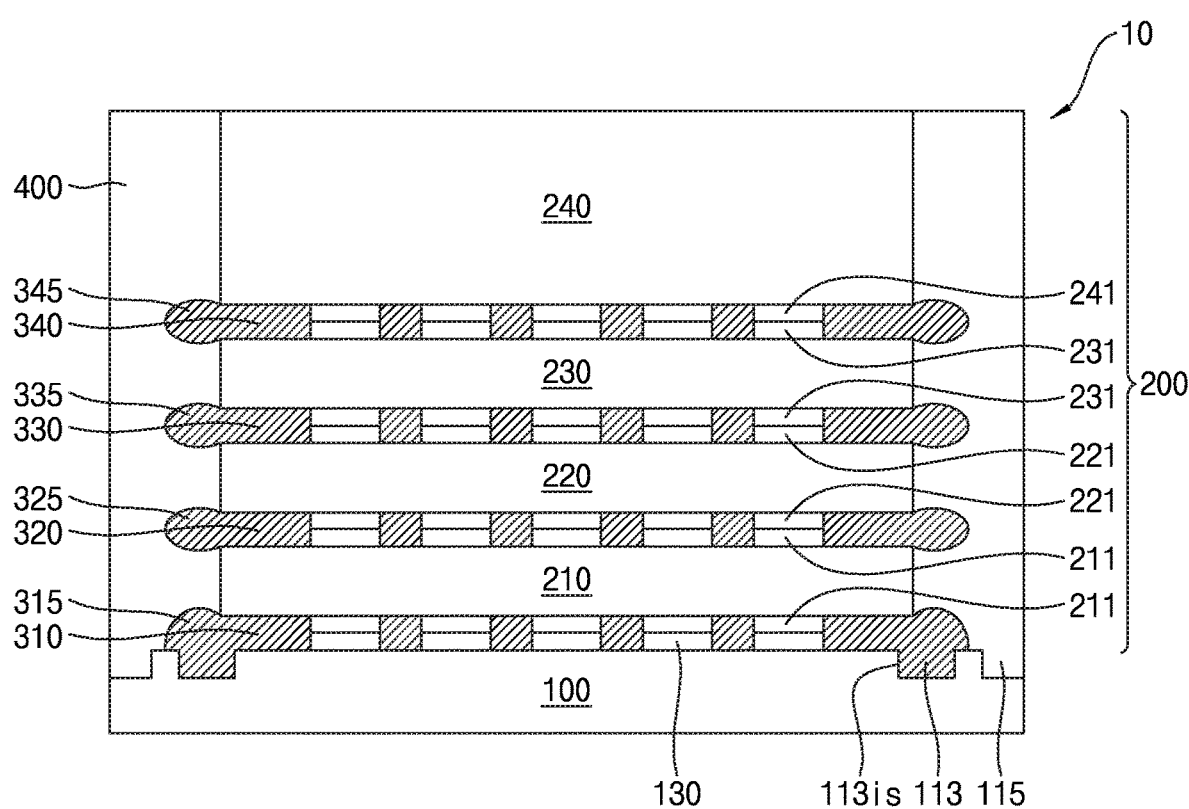
FIG. 11 is a view illustrating a side cross-section of a semiconductor package according to an exemplary embodiment of the present disclosure.
Figure 12:
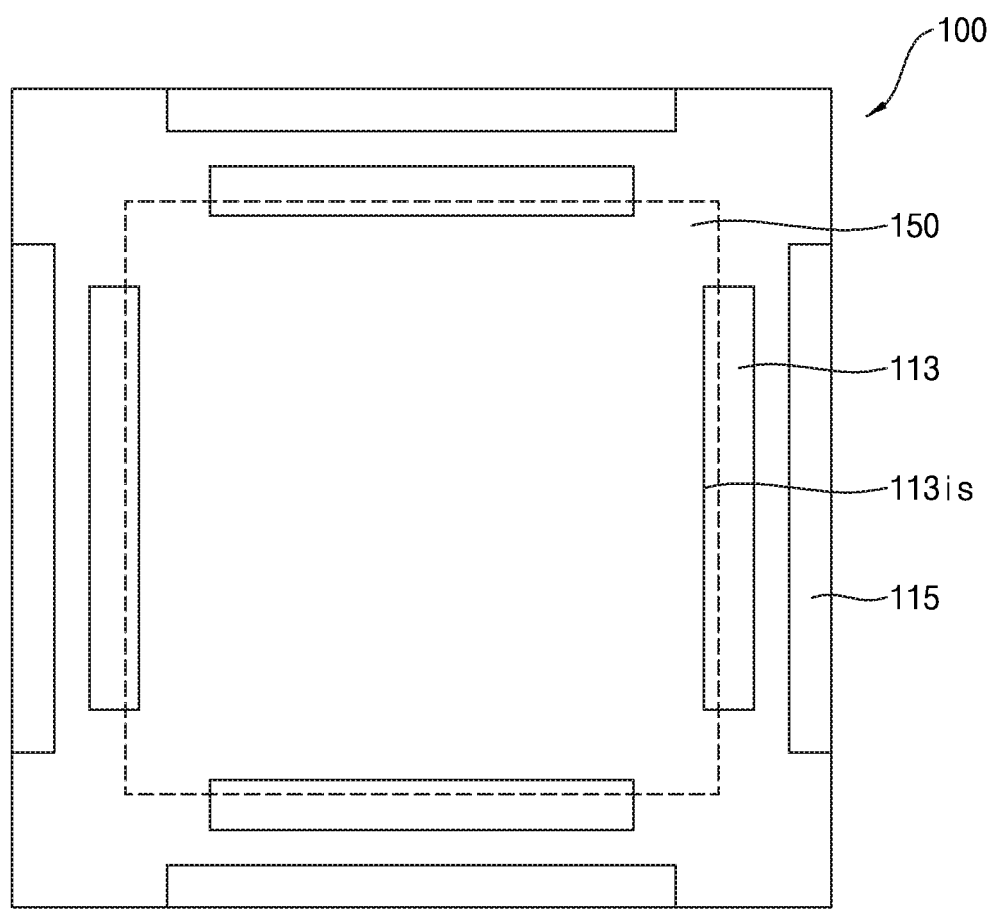
FIGS. 12 and 13 are top views of a buffer according to various exemplary embodiments of the present disclosure.
Figure 13:
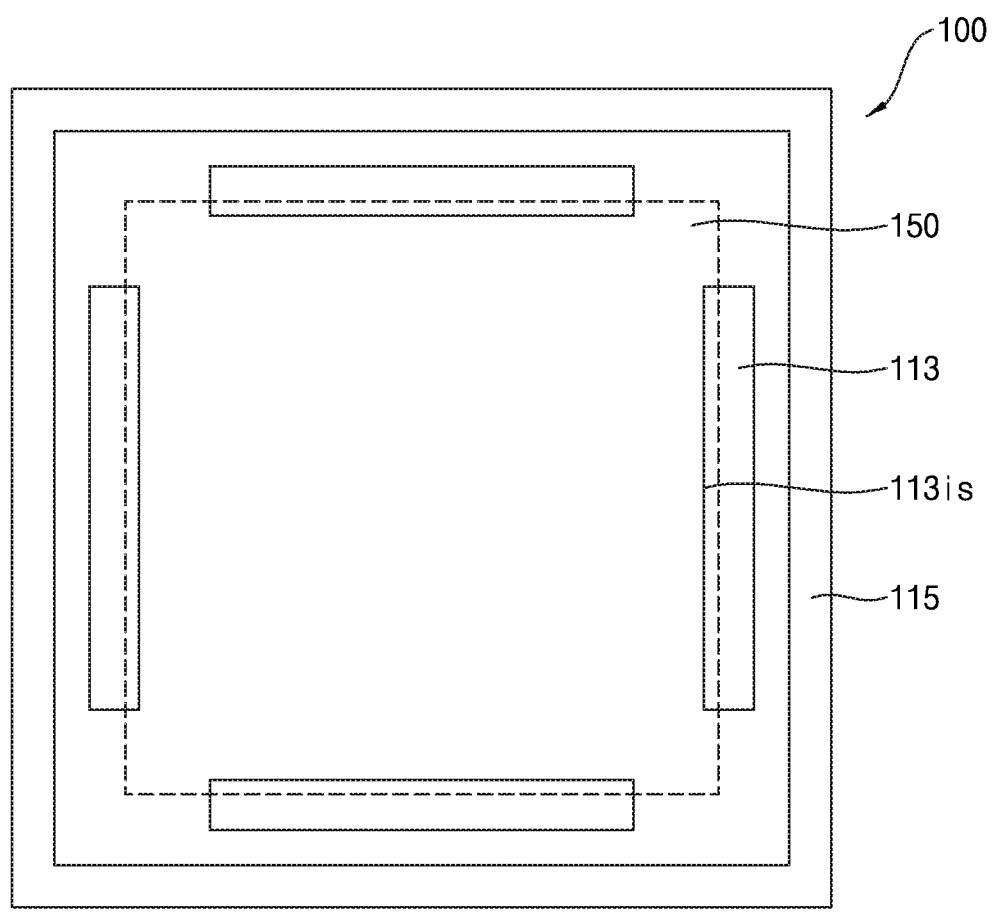

FIG. 11 is a view illustrating a side cross-section of the semiconductor package 10 according to an exemplary embodiment of the present disclosure. FIGS. 12 and 13 are top views of the buffer 100 according to various exemplary embodiments of the present disclosure. For convenience of explanation, a further description of elements and technical aspects previously described may be omitted.

Referring to FIG. 11, the trench 110 may include an outer trench 115 and an inner trench 113. The outer trench 115 may be disposed closer to the edges of the buffer 100 than the inner trench 113. In an exemplary embodiment, a portion of the fillet 315 of the adhesive layer 310 may be located in the inner trench 113, and another portion of the fillet 315 may be located in the outer trench 115. Since the trench 110 includes the outer trench 115 and the inner trench 113, even when the adhesive layer 310 and the fillet 315 have a low viscosity, leakage of the fillet 315 to the outside of the semiconductor package 10 may be effectively prevented.

Referring to FIGS. 11 and 12, the outer side of the outer trench 115 may be open. For example, the outer side of the outer trench 115 may extend to the edge (periphery) of the buffer 100. The outer trench 115 may have a greater length than the inner trench 113. Referring to FIG. 13, in an exemplary embodiment, the outer trench 115 may have a frame shape in a top view. For example, the outer trench 115 may be formed as a frame extending around the entire periphery of the buffer 100. In this case, the outer trench 115 may accommodate the molding material 400, whereby the bonding force between the molding material 400 and the buffer 100 may be increased. An inner side surface 113is of the inner trench 113 may be located within the edge (periphery) of the chip area 150.

Figure 14:
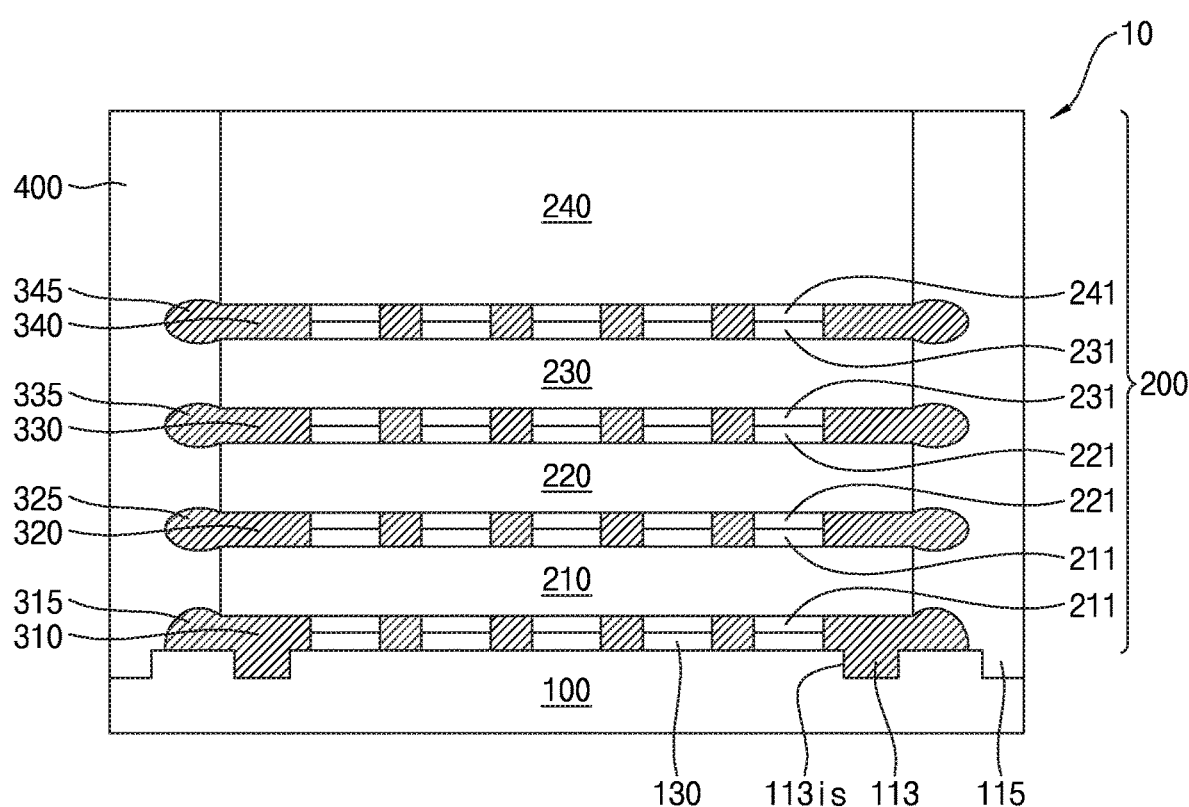
FIG. 14 is a view illustrating a side cross-section of a semiconductor package according to an exemplary embodiment of the present disclosure.
Figure 15:
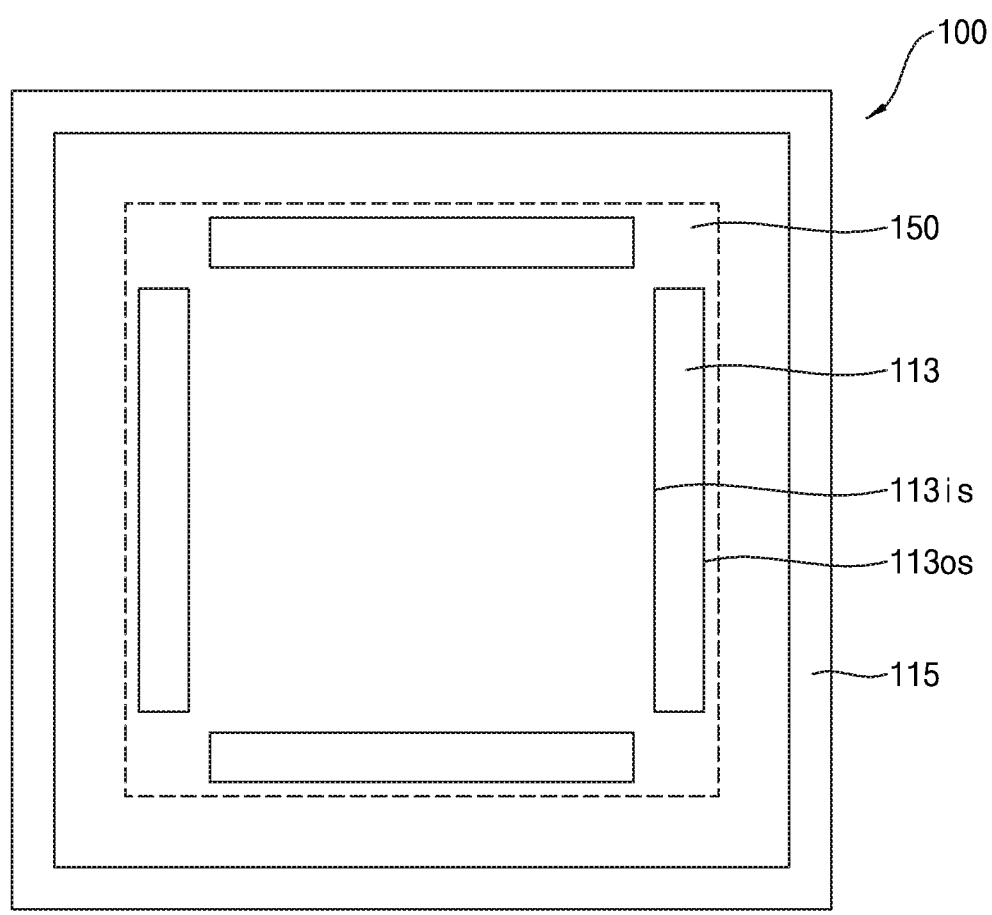
FIG. 15 is a top view of a buffer according to an exemplary embodiment of the present disclosure.

FIG. 14 is a view illustrating a side cross-section of the semiconductor package 10 according to an exemplary embodiment of the present disclosure. FIG. 15 is a top view of the buffer 100 according to an exemplary embodiment of the present disclosure. For convenience of explanation, a further description of elements and technical aspects previously described may be omitted.

Referring to FIGS. 14 and 15, in a top view, an outer side surface 113os of the inner trench 113 may be located within the chip area 150 of the buffer 100. In this case, the inner trench 113 may accommodate a portion of the adhesive layer 310, and thus, the formation of the fillet 315 may be reduced.

Figure 16:
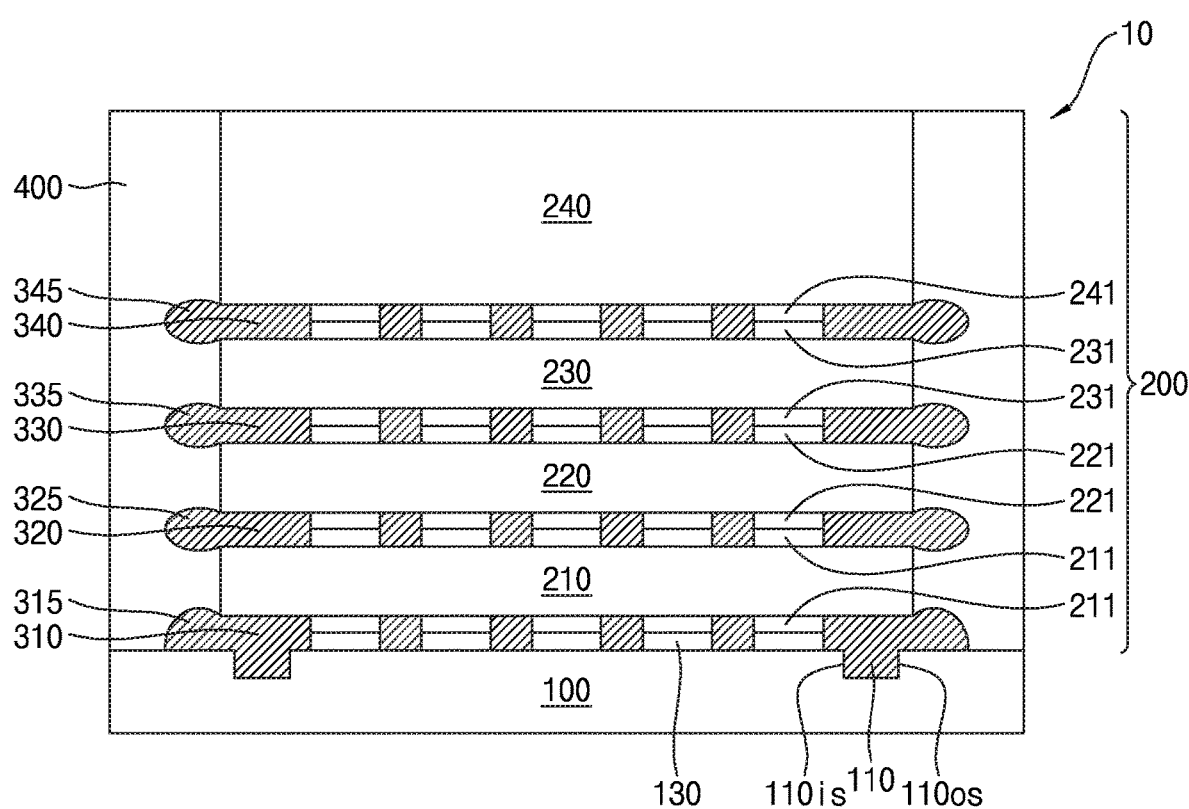
FIG. 16 is a view illustrating a side cross-section of a semiconductor package according to an exemplary embodiment of the present disclosure.
Figure 17:
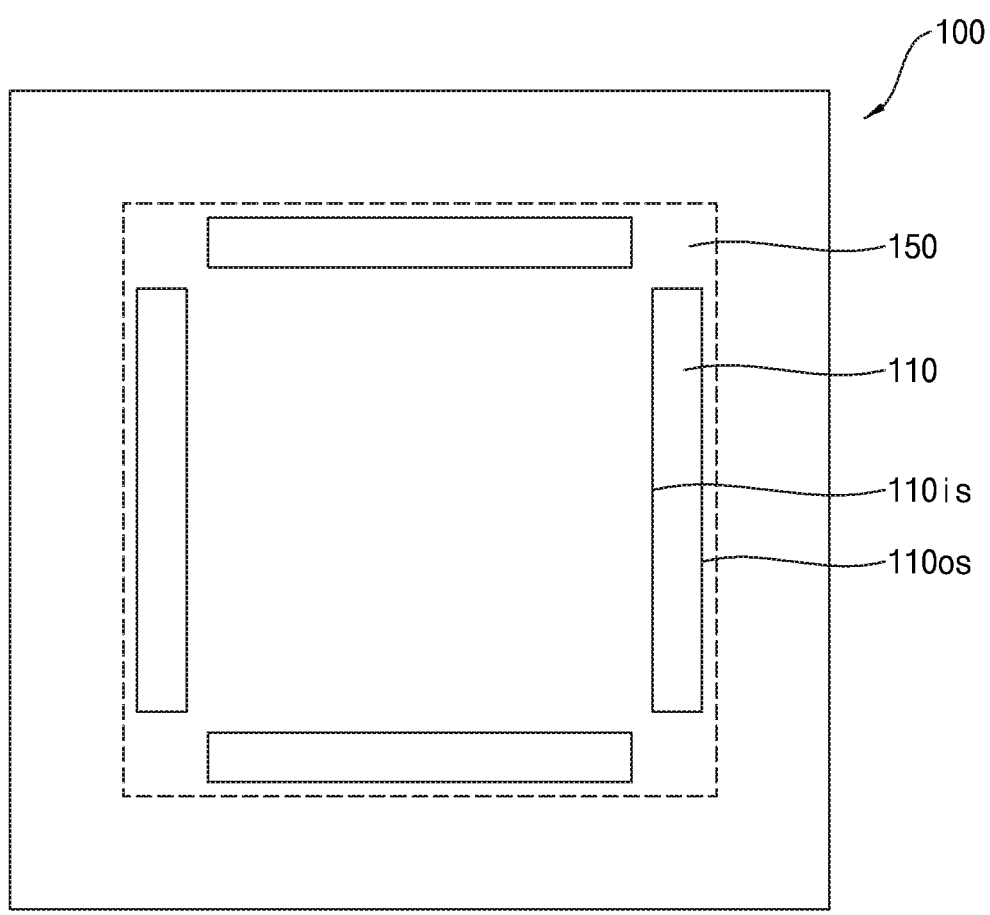
FIG. 17 is a top view of a buffer according to an exemplary embodiment of the present disclosure.

FIG. 16 is a view illustrating a side cross-section of the semiconductor package 10 according to an exemplary embodiment of the present disclosure. FIG. 17 is a top view of the buffer 100 according to an exemplary embodiment of the present disclosure. For convenience of explanation, a further description of elements and technical aspects previously described may be omitted.

Referring to FIGS. 16 and 17, in a top view, the trench 110 may be located within the chip area 150 of the buffer 100. Within the chip area 150, a space may exist between the outer side surface 110os of the trench 110 and the edge (periphery) of the chip area 150. In this case, the trench 110 may accommodate a portion of the adhesive layer 310. Thereby, the formation of the fillet 315 may be reduced, and thus, leakage of the fillet 315 to the outside of the semiconductor package 10 may be prevented.

Figure 18:
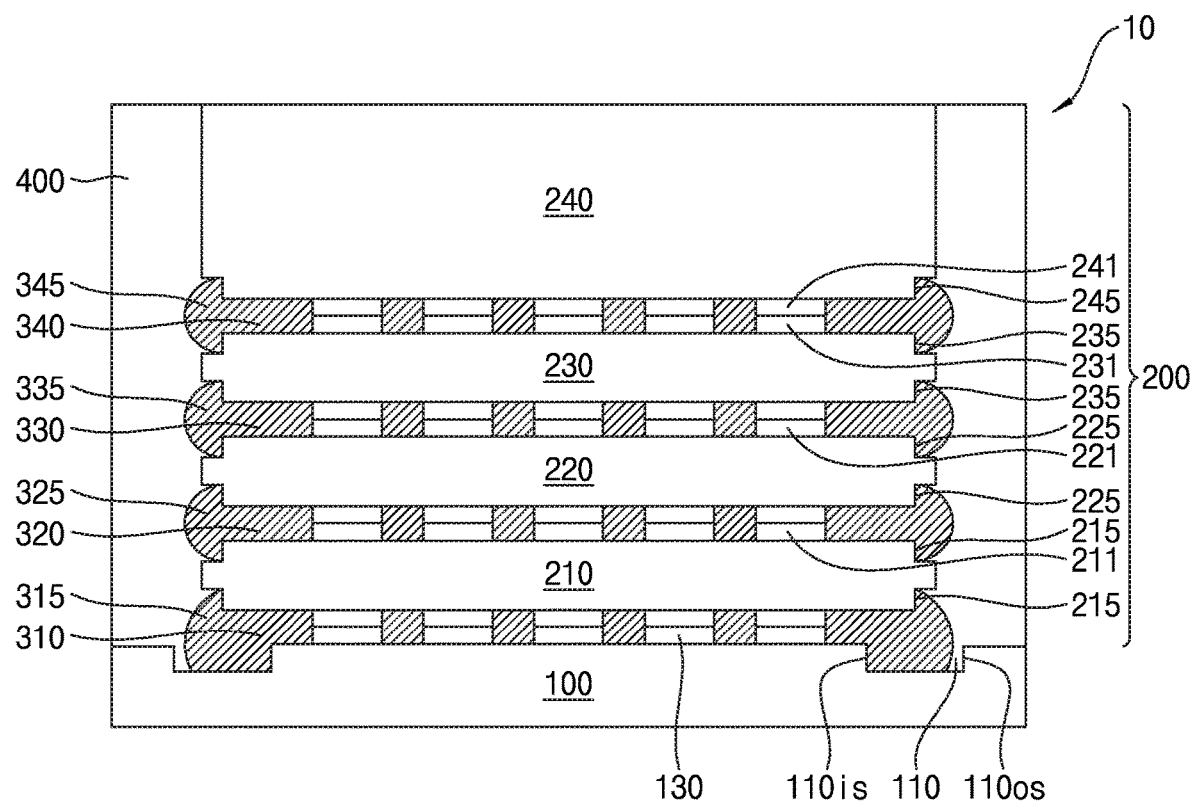
FIG. 18 is a view illustrating a side cross-section of a semiconductor package according to an exemplary embodiment of the present disclosure.
Figure 19:
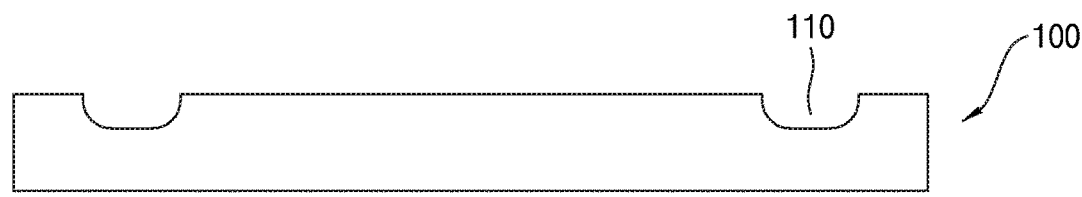
FIGS. 19 to 22 are views illustrating a side cross-section of a buffer according to various exemplary embodiments of the present disclosure.
Figure 20:
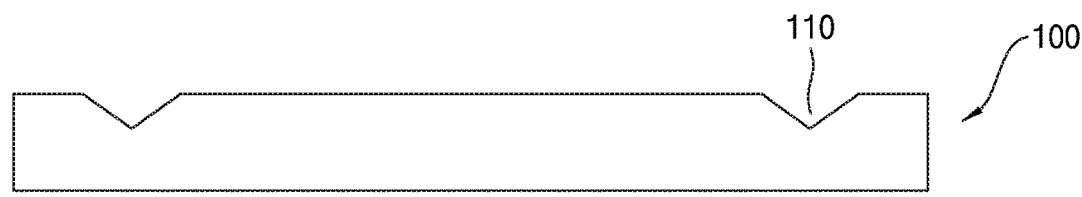
Figure 21:
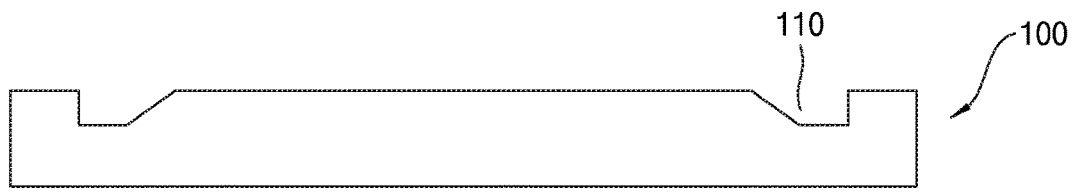
Figure 22:
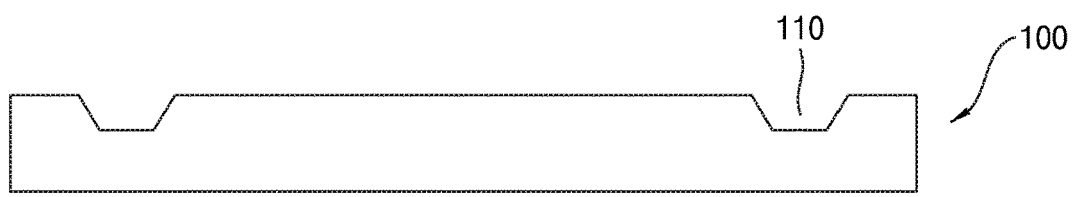

FIG. 18 is a view illustrating a side cross-section of the semiconductor package 10 according to an exemplary embodiment of the present disclosure. For convenience of explanation, a further description of elements and technical aspects previously described may be omitted.

Referring to FIG. 18, the chips 210, 220, 230 and 240 of the chip stack 200 may include respective chip trenches 215, 225, 235 and 245 disposed in the edge of the chip. The chip trenches 215, 225, 235 and 245 may accommodate the fillet 315 of the adhesive layer 310 or the inter-chip fillets 325, 335 and 345 of the inter-chip adhesive layers 320, 330 and 340, and may thus prevent leakage of the fillet 315 or the inter-chip fillets 325, 335 and 345 to the outside of the semiconductor package 10.

Referring to FIG. 18, the chips 210, 220, 230 and 240 may include a plurality of chip trenches 215, 225, 235 and 245, which are disposed in the top surfaces and the bottom surfaces of the edge portions of the chips. The outer sides of the chip trenches 215, 225, 235 and 245 may be open. The presence or absence of the chip trenches 215, 225, 235 and 245, the number thereof, and the positions thereof in the respective chips 210, 220, 230 and 240 may differ from each other.

FIGS. 19 to 22 are views illustrating the side cross-section of the buffer 100 according to various exemplary embodiments of the present disclosure. For convenience of explanation, a further description of elements and technical aspects previously described may be omitted.

Referring to FIGS. 19 to 22, the trench 110 may have a semicircular-shaped or polygonal-shaped vertical cross-section.

Figure 23:
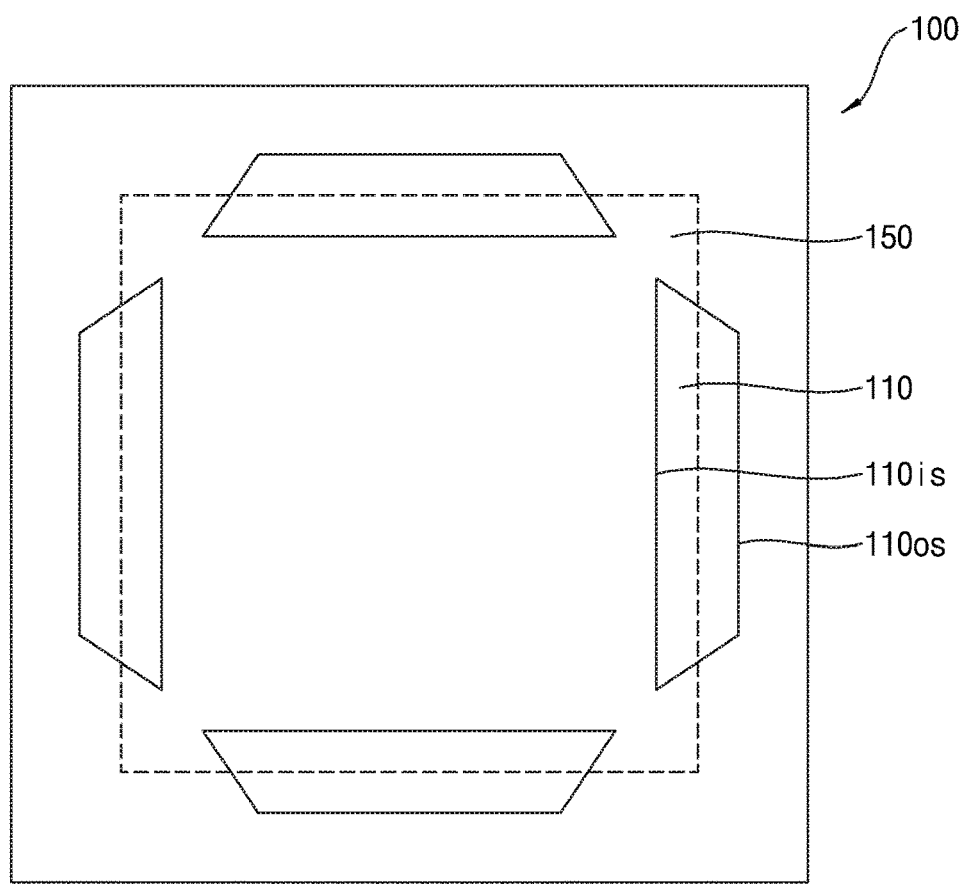
FIGS. 23 and 24 are top views of a buffer according to various exemplary embodiments of the present disclosure.

FIG. 23 is a top view of the buffer 100 according to an exemplary embodiment of the present disclosure. For convenience of explanation, a further description of elements and technical aspects previously described may be omitted.

Referring to FIG. 23, the trench 110 may have a trapezoidal shape in which the inner side surface 110is thereof is longer than the outer side surface 110os thereof in a top view. As a result of this configuration, a greater amount of fillet 315 may be accommodated in a relatively wide portion of the trench 110 that corresponds to the center portion C of the edge of the chip area 150, at which the fillet 315 spreads excessively, and thus, leakage of the fillet 315 to the outside may be prevented.

Figure 24:
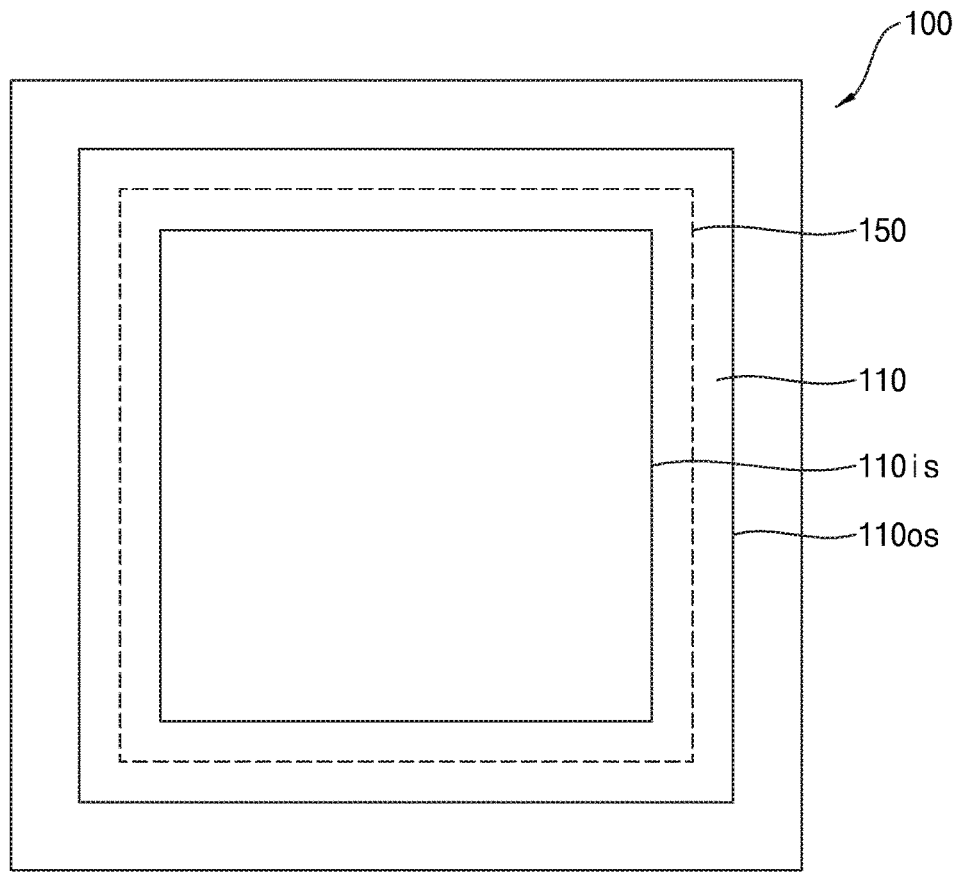

FIG. 24 is a top view of the buffer 100 according to an exemplary embodiment of the present disclosure. For convenience of explanation, a further description of elements and technical aspects previously described may be omitted.

Referring to FIG. 24, the buffer 100 may include a trench 110 that has a frame shape in a top view.

Figure 25:
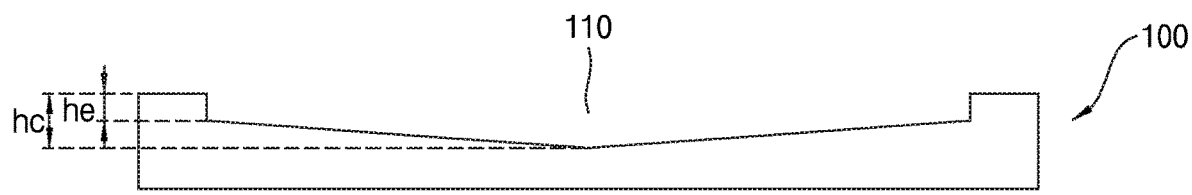
FIGS. 25 and 26 are views illustrating a side cross-section of a buffer according to various exemplary embodiments of the present disclosure.
Figure 26:
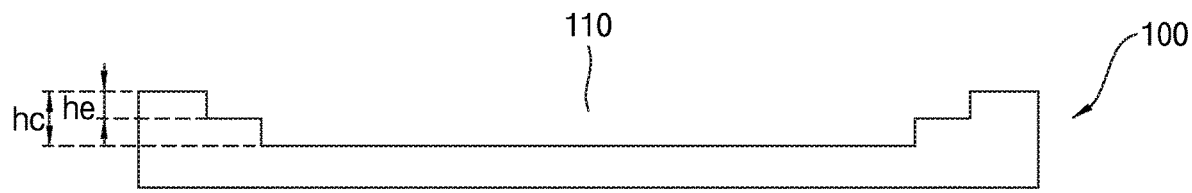

FIGS. 25 and 26 are views illustrating the side cross-section of the buffer 100 according to various exemplary embodiments of the present disclosure. For convenience of explanation, a further description of elements and technical aspects previously described may be omitted.

Referring to FIGS. 25 and 26, the trench 110 may be formed such that the center portion of each side thereof has a greater depth than the corner portion of each side thereof. For example, each side of the trench 110, which may have a frame shape in a top view, may have a center portion having a greater depth than a corner portion of that side of the trench 110. In the case of a trench 110 having a frame shape in a top view, leakage of the fillet 315 to the outside of the package may be prevented. However, it may be difficult to maintain a constant width of the fillet 315 outside the chip area 150. Therefore, the center portion of the trench 110, which corresponds to the center portion of the edge of the chip area 150, at which a large amount of fillet 315 is formed, may be formed to have a depth he greater than the depth he of the corner portion of the trench 110, whereby the width of the fillet 315 may be maintained constant.

As described above, in the semiconductor package 10 according to exemplary embodiments of the disclosure, the trench 110 may be formed in the buffer 100 to accommodate a portion of the fillet 315. Since a portion of the fillet 315 of the adhesive layer 310 is located in the trench 110, the width of the fillet 315 may be maintained to be substantially constant in a top view, and excessive spreading of the fillet 315 and resultant leakage thereof to the outside of the package may be prevented. When the width of the fillet 315 is described as being substantially constant, it is to be understood that the width of the fillet 315 is exactly constant, or is approximately constant within a measurement error as would be understood by a person having ordinary skill in the art.

As is apparent from the above description, according to exemplary embodiments of the present disclosure, a semiconductor package including a chip stack may be configured such that a trench is formed in a buffer. Therefore, in a semiconductor package including a chip stack according to an exemplary embodiment, a portion of a fillet of an adhesive layer may be located in a trench. Since the fillet of the adhesive layer is located in the trench, the width of the fillet may be maintained to be substantially constant in a top view, and leakage of the fillet to the outside of the package may be prevented. As a result, the occurrence of defects such as, for example, moisture absorption or delamination, may be reduced.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A semiconductor package, comprising:
a buffer;
a chip stack mounted on the buffer;
an adhesive layer disposed between the buffer and the chip stack; and
a molding material surrounding the chip stack,
wherein the buffer comprises a plurality of trenches disposed adjacent to each of a plurality of edges of the buffer,
wherein each of the trenches comprises an outer trench and an inner trench, and no intervening trenches are disposed between the outer trench and the inner trench,
wherein the outer trench is disposed closer to a corresponding adjacent edge of the edges of the buffer than the inner trench,
wherein the outer trench is shorter than the corresponding adjacent edge of a chip area,
wherein the chip area overlaps a portion of the inner trench in a top view, and the chip area does not overlap the outer trench in the top view.

2. The semiconductor package of claim 1, wherein the chip stack comprises:
a plurality of chips stacked on one another; and
a plurality of inter-chip adhesive layers disposed between the plurality of chips.

3. The semiconductor package of claim 2, wherein an uppermost chip of the plurality of chips is thicker than other chips of the plurality of chips.

4. The semiconductor package of claim 2, wherein the chip stack is disposed in the chip area in the top view,
wherein the inter-chip adhesive layers comprise inter-chip fillets protruding to an outside of the chip area in the top view.

5. The semiconductor package of claim 2, wherein each of the chips comprises an opened chip trench disposed at an edge thereof.

6. The semiconductor package of claim 5, wherein an outer side of the opened chip trench is open.

7. The semiconductor package of claim 2, wherein each of the chips comprises a plurality of opened chip trenches disposed in a top surface and a bottom surface of an edge thereof.

8. The semiconductor package of claim 1, wherein a depth of each of the inner trenches and a depth of each of the outer trenches is about 50% or less of a vertical thickness of the buffer.

9. The semiconductor package of claim 1, wherein, in the top view, an inner side surface of each of the inner trenches is located within the chip area of the buffer, and an outer side surface of each of the inner trenches is located outside the chip area of the buffer.

10. The semiconductor package of claim 9, wherein the inner side surface and the outer side surface of each of the inner trenches are about equally spaced apart from the corresponding adjacent edge of the chip area in the top view.

11. The semiconductor package of claim 1, wherein an inner side surface of each of the inner trenches is vertically aligned with the corresponding adjacent edge of the chip area of the buffer.

12. The semiconductor package of claim 1, wherein each of the outer trenches is open to an outside of the buffer.

13. The semiconductor package of claim 1, wherein the outer trench is an opened trench, and an outer side of the opened trench is open to an outside of the buffer.

14. The semiconductor package of claim 1, wherein the outer trench has a greater length than the inner trench.

15. The semiconductor package of claim 1, wherein an outer side surface of the inner trench is located within the chip area of the buffer in the top view.

16. The semiconductor package of claim 1, wherein each of the inner trenches is located within the chip area of the buffer in the top view.

17. The semiconductor package of claim 1, wherein each of the trenches has a polygonal-shaped vertical cross-section.

18. A semiconductor package, comprising:
a buffer;
a chip stack mounted on the buffer;
an adhesive layer disposed between the buffer and the chip stack; and
a molding material surrounding the chip stack,
wherein the buffer comprises:
a chip area occupied by the chip stack in a top view;
a plurality of buffer bumps disposed on a top surface of the buffer; and
a plurality of trenches disposed adjacent to a plurality of edges of the buffer,
wherein the chip stack comprises:
a plurality of chips stacked on one another; and
a plurality of inter-chip adhesive layers disposed between the plurality of chips,
wherein each of the plurality of chips comprises a plurality of chip bumps,
wherein the adhesive layer comprises a fillet,
wherein a portion of the fillet is located in at least one of the plurality of trenches,
wherein each of the trenches comprises an outer trench and an inner trench, and no intervening trenches are disposed between the outer trench and the inner trench,
wherein the outer trench is disposed closer to a corresponding adjacent edge of the edges of the buffer than the inner trench,
wherein the outer trench is shorter than the corresponding adjacent edge of the chip area,
wherein an inner side surface of the inner trench is located within the chip area in a top view,
wherein an outer side surface of the inner trench is located outside the chip area in the top view,
wherein the outer trench is located outside the chip area in the top view.

* * * * *